(12) United States Patent
Hamlin

(10) Patent No.: US 6,857,108 B2
(45) Date of Patent: Feb. 15, 2005

(54) INTERACTIVE REPRESENTATION OF STRUCTURAL DEPENDENCIES IN SEMICONDUCTOR DESIGN FLOWS

(75) Inventor: Christopher L. Hamlin, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 178 days.

(21) Appl. No.: 10/210,651

(22) Filed: Jul. 31, 2002

(65) Prior Publication Data

US 2004/0025119 A1 Feb. 5, 2004

(51) Int. Cl.[7] .............................................. G06F 17/50
(52) U.S. Cl. .......................... 716/2; 1/5; 1/18; 345/419
(58) Field of Search ............................. 700/30; 703/14; 716/1, 2, 5, 18, 4, 6; 345/419

(56) References Cited

U.S. PATENT DOCUMENTS

| | | | |
|---|---|---|---|
| 4,656,592 A | 4/1987 | Spaanenburg et al. | |
| 5,752,070 A | 5/1998 | Martin et al. | 395/800.33 |
| 5,818,728 A | 10/1998 | Yoeli et al. | |
| 5,818,729 A | 10/1998 | Wang et al. | |
| 5,898,677 A | 4/1999 | Deeley et al. | 370/276 |
| 6,152,613 A | 11/2000 | Martin et al. | 395/800.33 |
| 6,269,277 B1 | 7/2001 | Hershenson et al. | 700/97 |
| 6,425,116 B1 * | 7/2002 | Duboc et al. | 716/18 |
| 6,459,136 B1 | 10/2002 | Amarilio et al. | |
| 6,717,576 B1 * | 4/2004 | Duluk et al. | 345/419 |
| 2003/0208284 A1 * | 11/2003 | Stewart et al. | 700/30 |

FOREIGN PATENT DOCUMENTS

| | | |
|---|---|---|
| JP | 01202397 | 7/2001 |
| JP | 02202886 | 7/2002 |

OTHER PUBLICATIONS

"Self–Reconfigurable Programmable Logic Device" by Reetinder Sidhu, et al.; File # 3115; University of Southern California, Office of Technology Licensing, Los Angeles, CA; www.usc.edu/academe/otl; Sep. 7, 2001.

"Sea–of–IP; An Ocean of Design Possibilities", Royal Phillips Electronics; Philips Semiconductors—Technology Home Pages; Sea–of–IP.

"Tensilica Navigates 'Sea of Processors' Designs" by Chris Edwards; *Electronics Times*; Jun. 14, 2001; www.eetimes.com., News Channels Semiconductors.

"On–Chip Networks Weighed as Wiring Alternative" by Ron Wilson, *Integrated System Design*, Jun. 25, 2001; www.eetimes.com. , News Channels Design Automation.

"Configurable Computing" by John Villasenor et al., Scientific American, Jun. 1997; www.sciam.com/0697issue/0697villasenor.html; Apr. 19, 2002.

"Simplify programmable–logic–IP integration" by Robert Cravotta, EDN Access, Apr. 11, 2002; www.e–insite.net/edn...x.asp?layout=article&articled=CA207117; Apr. 30, 2002.

"Altera casts spotlight on IP integration tool" by Crista Souza, EBN, Mar. 7, 2002; www.ebnews.com/story/OEG20020307S0018; Apr. 30, 2002.

* cited by examiner

*Primary Examiner*—Thuan Do
(74) *Attorney, Agent, or Firm*—Suiter West PC LLO

(57) ABSTRACT

The present invention is directed to an interactive representation of structural dependencies in semiconductor design flows. In an aspect of the present invention, a method for providing interactive representation of structural dependencies in a semiconductor design flow as implemented by an information handling system may include detecting a modified value of a parameter of the semiconductor design flow. At least one parameter dependent on the changed parameter is identified, the dependent parameter previously entered by a user.

20 Claims, 4 Drawing Sheets

INTERACTIVE REPRESENTATION OF STRUCTURAL DEPENDENCIES IN SEMICONDUCTOR DESIGN FLOWS

CROSS REFERENCE TO RELATED APPLICATIONS

The present application hereby incorporates the following United States Patent Applications by reference in their entirety:

| Attorney Docket Number | Serial No. | Filing Date |
| --- | --- | --- |
| LSI 01-390 | 10/015,194 | Nov. 20, 2001 |
| LSI 01-488 | 10/021,414 | Oct. 30, 2001 |
| LSI 01-489 | 10/021,619 | Oct. 30, 2001 |
| LSI 01-490 | 10/021,696 | Oct. 30, 2001 |
| LSI 01-524B | 10/044,781 | Jan. 10, 2002 |
| LSI 01-543 | 10/135,189 | Apr. 30, 2002 |
| LSI 01-695 | 09/842,335 | Apr. 25, 2001 |
| LSI 01-827 | 10/034,839 | Dec. 27, 2001 |
| LSI 01-828B | 10/061,660 | Feb. 1, 2002 |
| LSI 02-0166 | 10/135,869 | Apr. 30, 2002 |
| LSI 02-0560 | 10/185,740 | Jun. 27, 2002 |
| LSI 02-4372 | 10/186,263 | Jun. 27, 2002 |
| LSI 02-0383 | 10/210,188 | Jul. 31, 2002 |

FIELD OF THE INVENTION

The present invention generally relates to the field of integrated circuits, and particularly to an interactive representation of structural dependencies in semiconductor design flows.

BACKGROUND OF THE INVENTION

Integrated circuit design and implementation is becoming more and more complex as the functionality and size of the circuits increases. A variety of users and manufacturers of devices utilizing integrated circuits desire an increasing array of functionality and performance in lower cost devices. To provide this functionality, producers of integrated circuits must become more efficient in the design and optimization of the circuits to ensure competitive positioning of their products.

One such area for optimization includes the use of "flows". Flows include procedures for taking semiconductor devices from concept to physical realization by invoking a succession of software design tools which implement logical and physical operations necessary for optimizing and verifying the correct behavior of the device. However, as the complexity of the integrated circuit increases, so does the complexity of the design flow.

For example, high complexity semiconductor devices, such as system-on-chip devices and the like, may be organized as networks or interconnected patterns of functional blocks which include a variety of semiconductor functional elements. However, changes to the functional blocks, changes to the elements of the functional blocks, routing between blocks and elements, and the like at one stage of the flow may affect earlier flow stages. Therefore, the resultant product may have inconsistencies and incompatibilities that must be addressed before a working product is realized.

Therefore, it would be desirable to provide a system and method for an interactive representation of structural dependencies in semiconductor design flows.

SUMMARY OF THE INVENTION

Accordingly, the present invention is directed to an interactive representation of structural dependencies in semiconductor design flows. In an aspect of the present invention, a method for providing interactive representation of structural dependencies in a semiconductor design flow as implemented by an information handling system includes detecting a modified value of a parameter of the semiconductor design flow. At least one parameter dependent on the changed parameter is identified, the dependent parameter previously entered by a user.

In an additional aspect of the present invention, a system for providing interactive representation of structural dependencies in a semiconductor design flow having a plurality of stages includes a memory, a processor and a display device. The memory is suitable for storing a program of instructions and the processor is communicatively coupled to the memory, the processor suitable for performing the program of instructions. A display device suitable for displaying data is also communicatively coupled to the processor. The program of instructions configures the processor to detect a modified value of a parameter of the semiconductor design flow and identify at least one parameter dependent on the changed parameter through use of a design relational database. The dependent parameter is modified at a stage of the design flow before the modification of the detected parameter.

In a further aspect of the present invention, a method for providing interactive representation of structural dependencies in a semiconductor design flow as implemented by an information handling system includes detecting a modified value of a parameter of the semiconductor design flow and identifying at least one parameter dependent on the changed parameter. The dependent parameter is identified through use of a design relational database indicating sets of relations between parameters of the design flow.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally now to FIGS. 1 through 4, exemplary embodiments of the present invention are shown. Semiconductor devices of moderate to high complexity entail millions of transistors organized in complex, often hierarchical, patterns. The procedures for taking such devices from concept to physical realization involve invoking a succession of software design tools which implement logical and physical operations necessary for optimizing and verifying the correct behavior of the device. This set of tools and the correct order of its invocation may be referred to as a "flow". In a flow employed to design a high complexity (i.e. high gate count) device, each tool often requires the setting of numerous parameters which determine the particular emphasis or mode of operation the tool brings to bear on the design at a particular stage.

In complex designs, often the choices made by the designer at one stage of the flow will have implications for the settings of parameters at another stage. In some instances, this interaction between flow stage settings and results may be iterative, which may be detrimental to forward progress in some instances, while in other instances may facilitate convergence on a superior design outcome. Thus, the use of a purely iterative process may be unpredictable.

The concept of "heuristic feedback" may describe the general capability for having different stages of a flow communicate with one another in feedback relationships. A more detailed discussion of this may be found in related patent application titled *System and Method for Coevolutionary Circuit Design* by Christopher Hamlin, which was previously incorporated by reference in its entirety. In the present discussion, in a contemplated embodiment, a method of setting up and implementing heuristic feedback in the sense of the previous disclosure is spelled out.

The present invention concerns a software structure for formally and graphically representing structural dependencies between elements of a semiconductor design flow such that modifications at any point in the flow are guaranteed to provoke appropriate adjustments anywhere else in the flow that the adjustments may be required.

In particular, this invention concerns a method for representing the necessary and sufficient conditions for operating a complex semiconductor design process, in such a way that a change made to any parameter or condition in any part of the tool set making up the flow will enforce fulfillment of any required changes arising elsewhere in the flow as a result.

Figure 1:
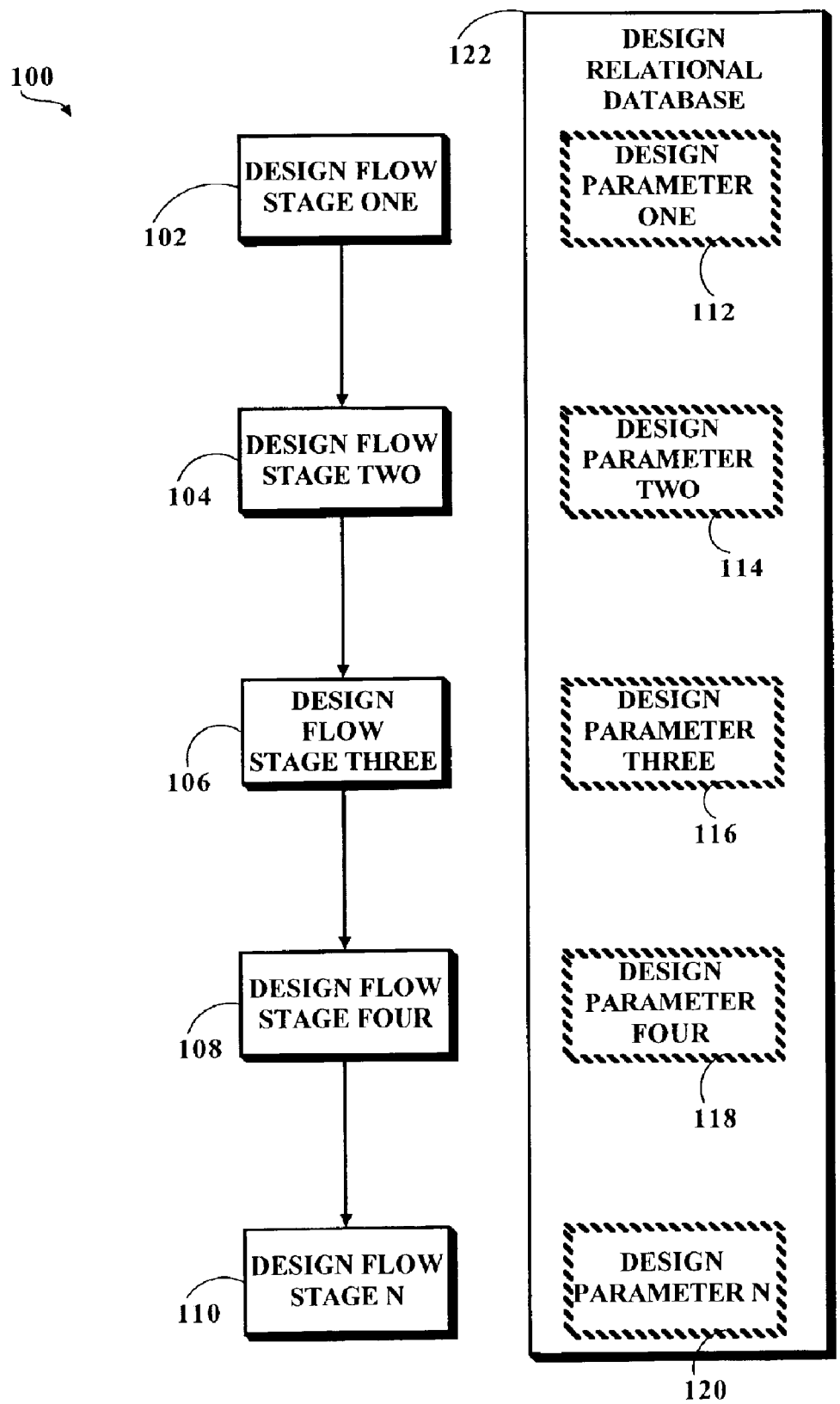
FIG. 1 is a flow diagram and block diagram of an exemplary embodiment of the present invention wherein a flow is utilized in conjunction with a relational database for management of design parameters.

Referring now to FIG. 1, an exemplary embodiment 100 of the present invention is shown wherein a flow is utilized in conjunction with a relational database for management of design parameters. A design flow may include a plurality of stages for accomplishing tasks required to design an integrated circuit, such as design flow stage one 102, design flow stage two 104, design flow stage three 106, design flow stage four 108 through design flow stage N 110 as shown in FIG. 1. The design flow stages may include design tools, database structures, scripts, sets of parameters, lists of commands, and the like as contemplated by a person of ordinary skill in the art. A variety of parameters may be modified and specified at each of the stages, such as the design parameter one 112, design parameter two 114, design parameter three 116, design parameter four 118 through design parameter N 120 by an integrated circuit designer, such as manually or automatically through the design process.

In some instances, a designer utilizing a design flow may change a design parameter at a latter stage of the process that has an effect on parameters of earlier design stages. In previous instances, the designer and/or flow may not take into consideration the effect of the change, and therefore not have the correction realized throughout the process. However, through utilization of the present invention, a system and method of heuristic feedback may be employed to provide the capability for having different stages of a flow communication with one another in feedback relationships. The system and method may be implemented in an embodiment of the present invention through the use of a design relational database 122.

Figure 2:
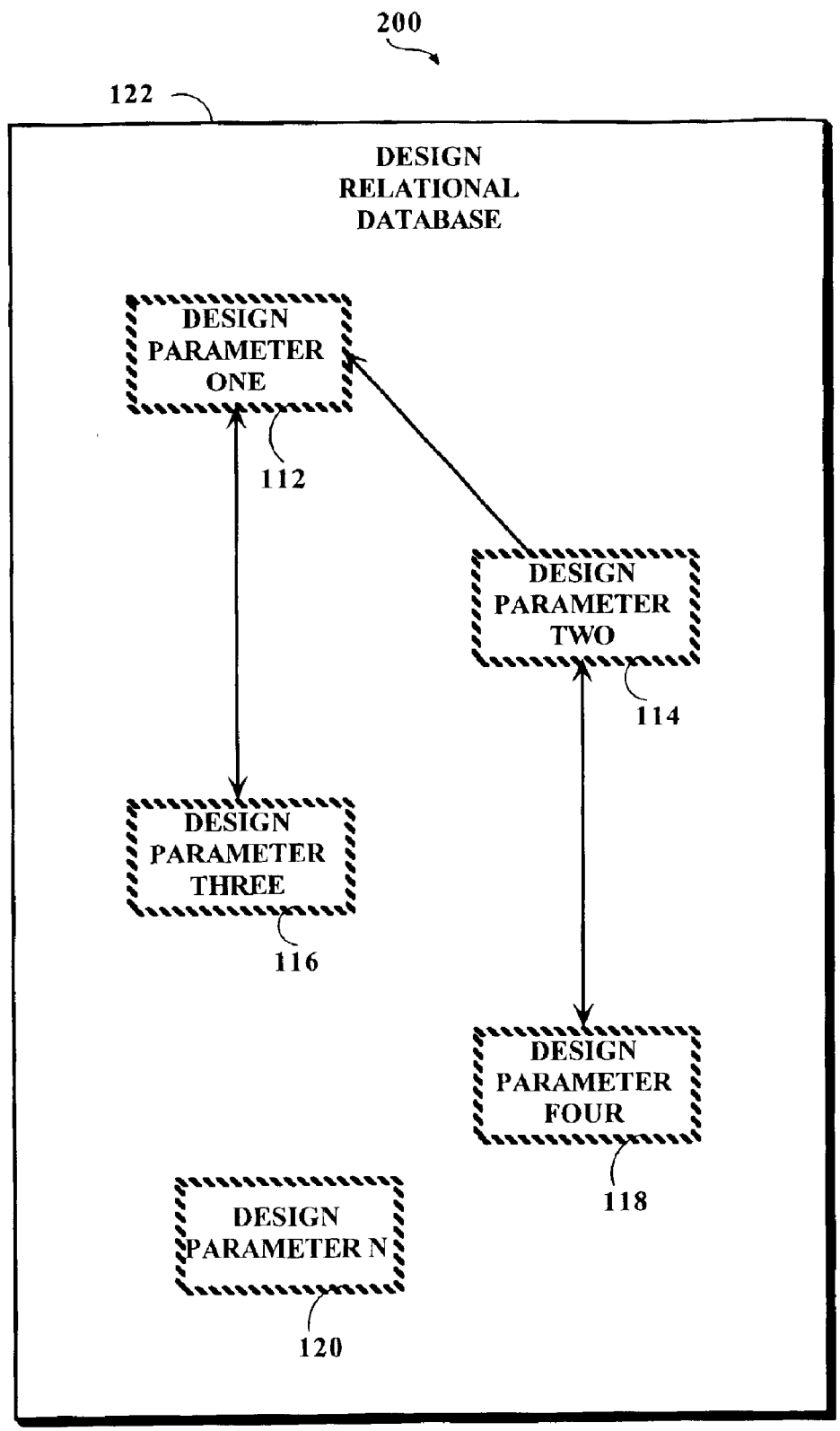
FIG. 2 is a block diagram of an exemplary embodiment of the present invention wherein a design relational database is shown.
Figure 3:
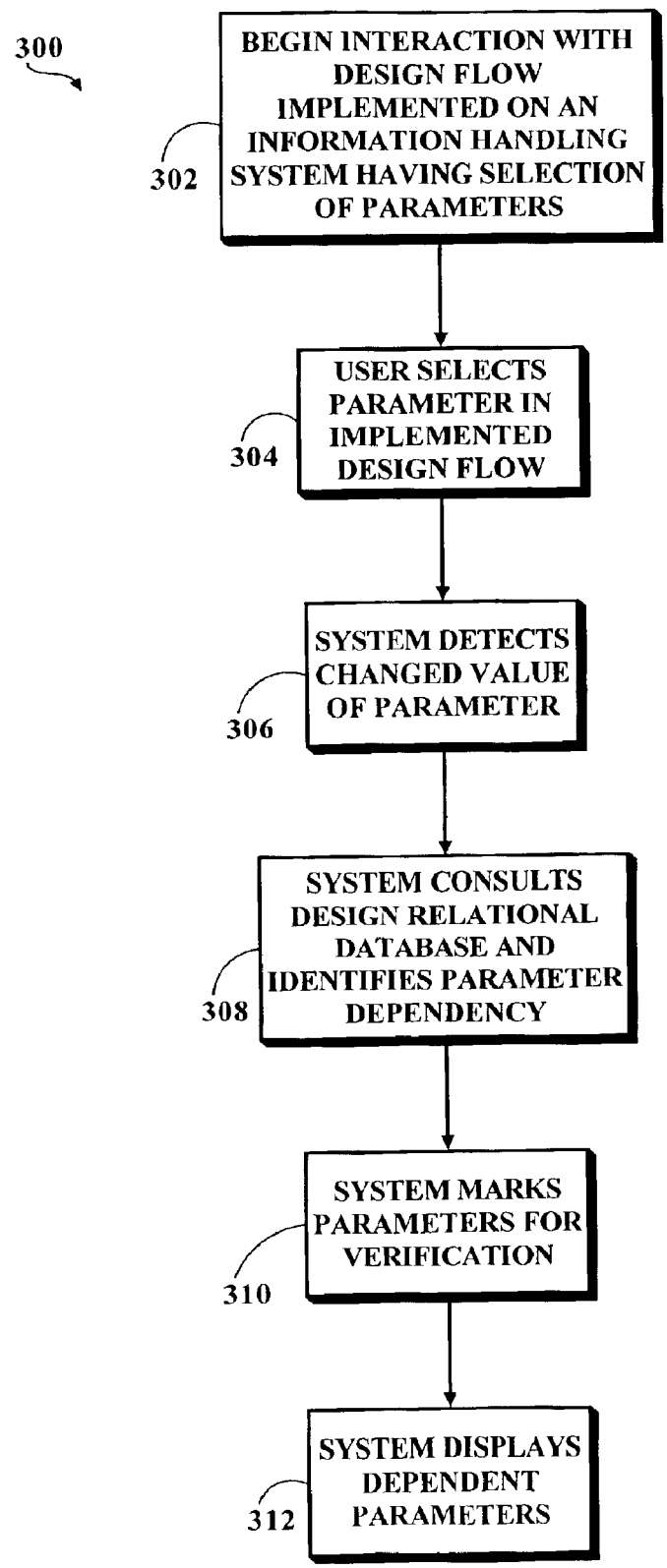
FIG. 3 is a flow diagram of an exemplary method of the present invention wherein a flow as implemented by an information handling system consults a design relational database to identify parameter dependency of parameters of the flow.

For example, referring now to FIG. 2, an embodiment 200 of the present invention is shown wherein a design relational database 122 is shown which is suitable for indicating relationships of design parameters 112, 114, 116, 118 & 120. Through use of the relational database of the present invention, changes to a parameter and its effect on other parameters, regardless of the stage originating the parameter, may be indicated. For instance, the relationship indicated between design parameter one 112 and design parameter three 116 indicates that a change to either parameter will have an effect on the other parameter. However, a change to design parameter two 114 will have an effect on design parameter one 112, but a change to design parameter one 112 will not affect design parameter two 114. In the present instance, design parameter N 120 may be changed without having a direct effect on the other design parameters. In this way, the interrelationship of design parameters may be shown, and heuristic feedback utilized to ensure that changes made to interdependent parameters will be realized regardless of where the change is made in the design flow.

The problem may be reduced to a multidimensional representation of dependencies which can be expressed as a first order predicate calculus. It has been shown that such problems may always be cast as sets of relations; therefore a relational database system comprises the necessary and sufficient resources for accommodating the flow dependency problem as stated.

The present invention may be implemented in a variety of ways, such as by an information handling system and the like. For instance, an information handling system may implement a design flow in accordance with the present invention, as shown in the exemplary method 300 depicted in FIG. 3. A user may begin interaction with a design flow implemented on an information handling system, the design flow enabling a user to interact with a selection of design parameters 302. For each element of the design flow (a tool, a database structure, a script, a set of parameters, a list of commands, and so on) a "drop-down" menu on the screen of a graphical user interface display of the information handling system shows a selection of parameters available for inspection and modification. The menu system may incorporate sub-menus which depend from entries in the higher-level menus as desired by a person of ordinary skill in the art.

Upon selecting an item in such a drop-down menu, a user (possibly the administrator or developer of a design flow) may choose to enter or modify a value associated with the menu item 304. For instance, suppose the item implicitly affects a number of other design parameters, such as associated tools, parameters, scripts, lists, and the like. The system, upon detecting the new or changed value of a parameter 306, may consult a database of dependent fields in other menus and sub-menus 308, and take action, such as (1) the system marks the parameters as being subject to verification, such as modification or validation, 310 and (2) the system presents the parameters seriatim on the screen for action by the user 312. In this way, a system of the present invention may employ heuristic feedback between dependent parameters regardless of which stage the parameter was generated, thereby promoting completeness and operability of the integrated circuit design.

In addition, in a contemplated embodiment, the system may automatically inhibit the continued operation of the flow undergoing modification until all flow element dependencies thus presented have been resolved to the satisfaction of the user and/or the underlying dependency evaluation mechanism.

A further property of the system is that in setting up a class of flows, the flow designer or administrator may specify explicitly all fields and relationships comprising the necessary and sufficient conditions for defining a successful flow. In other words the flow may be considered complete, if desired, if and only if all dependencies between flow elements have been spelled out, and have been fully satisfied for a particular flow undergoing (re)definition or modification as described.

Figure 4:
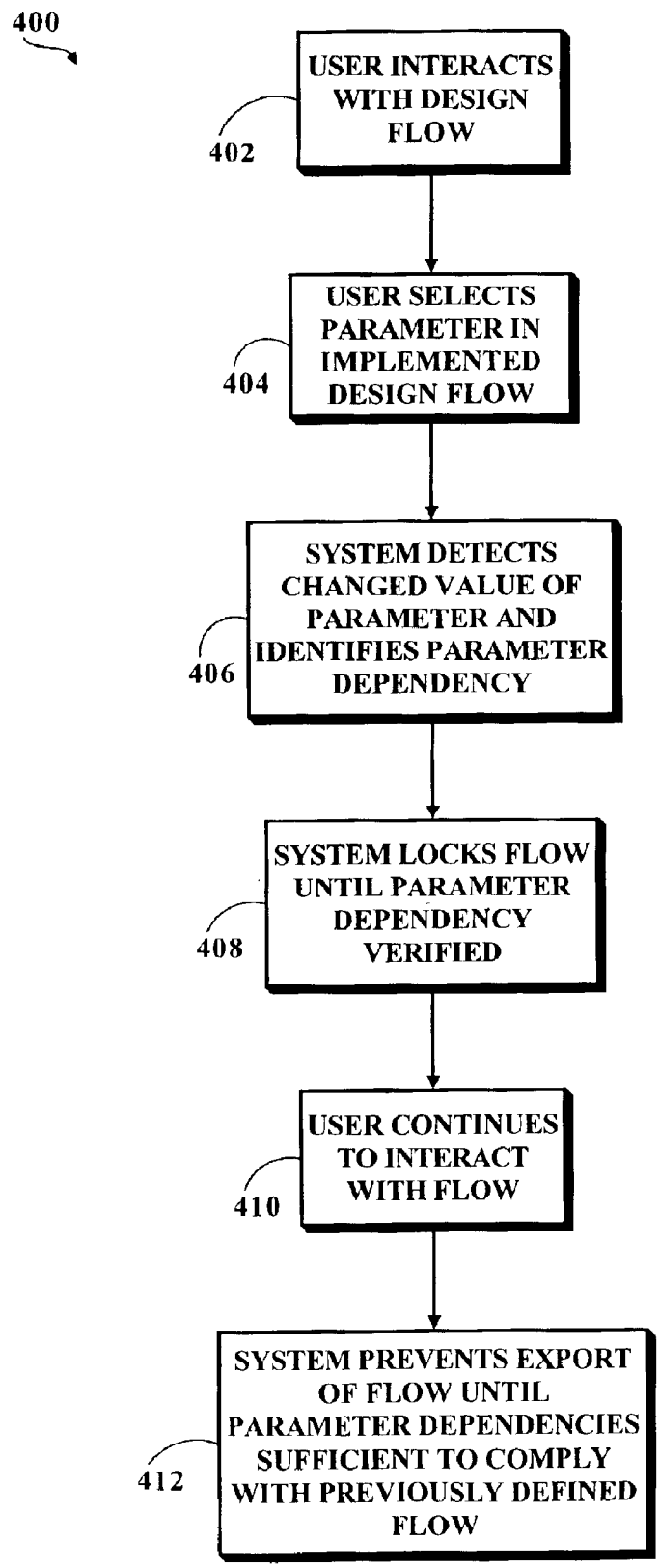
FIG. 4 is a flow diagram of an exemplary method of the present invention wherein a system employing the present invention ensures completion of a circuit design before exportation of the design.

For example, referring now to FIG. 4, an exemplary method 400 of the present invention is shown wherein a system employing the present invention ensures completion of a circuit design before exportation of the design. A user interacts with a design flow 402 and selects parameters in the design flow 404. The system detects a changed value of a parameter, such as a newly entered parameter, change to preexisting value, and the like, and identifies parameter dependency 406 through use of a relational database. To promote completion of the design in an efficient manner, the system locks the flow until parameter dependency is verified 408 as indicated by the database. For instance, the system may require that a user verify dependent values indicated by the database before the user continues, thereby minimizing dependency changes that may need to be made at a later time. Alternatively, such "locking" of the flow may be performed at the completion of a stage, or other checkpoints as contemplated by a person of ordinary skill in the art.

Once the dependencies are verified, the user may continue to interact with the flow 410. A final check may be performed upon completion of the flow before exportation of the flow for instantiation of the design so that parameter dependencies sufficient to comply with previously defined flow requirements are met 412. For example, a user may specify that certain portions of the flow must be completed before testing or other exportation of the design.

Any such dependencies defining the necessary and sufficient conditions for a successful flow can be expressed under the invention described here, and the need for modification and validation of the dependent data items can be enforced such that the flow will not be admitted for use until all dependencies are satisfied.

Numerous examples of such relationships are contemplated by the present invention. For instance, such relationships may include dependencies between layout, placement, routing, power, clocking, area, layers, IP, transistor types, and so on, and thus influence mutually the selection of options and parameters across a wide range of tools between RTL and GDS-11 levels in the flow.

From the standpoint of the graphical user interface, many alternative techniques are available for expressing the dependencies involved and their current states, such as: color, texture, two dimensional maps, drafting conventions, Venn diagrams, tables, charts, flow graphs, icons, automatic forms, and so on; the system of drop-down menus described above (which is only one of many possible instantiations of the invention disclosed) may exhibit altered colors or outlines to indicate the presence of dependent fields for verification, such as update or validation. Thus, the user (administrator, designer) is assured of being presented with all of the elements requiring attention in a convenient sequential ordering, which leaves no ambiguity with respect to whether or not every conditional or dependent requirement has been addressed before the flow is permitted to progress, and is further described in the applications which were previously incorporated by reference.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the system and method of the present invention and many of its attendant advantages will be understood by the forgoing description. It is also believed will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for providing interactive representation of structural dependencies in a semiconductor design flow as implemented by an information handling system, comprising:

detecting a modified parameter of the semiconductor design flow; and identifying at least one parameter dependent on the modified parameter, the dependent parameter previously entered by a user wherein the at least one parameter dependent on the modified parameter is identified through a design relational database, the design relational database indicating sets of relations between parameters of the design flow.

2. The method as described in claim 2, wherein the relational database indicates at least one of directional and interdependent parameters.

3. The method as described in claim 1, wherein the relational database is viewable by a user so that when the relational database is viewed by a user; the relational database shows indications of parameter relationships.

4. The method as described in claim 1, wherein the semiconductor design flow includes a plurality of stages, the detected modified parameter being at a later stage of the design flow than the at least one parameter which was identified as dependent on the modified parameter.

5. The method as described in claim 1, wherein exportation of a design of a semiconductor device resultant for the design flow is prevented until flow parameters and relationships specified by a flow designer are completed.

6. The method as described in claim 1, wherein modification to a subsequent parameter of the design flow is prevented until identified dependent parameters have been verified.

7. The method as described in claim 1, further comprising displaying the identified dependent parameter.

8. A system for providing interactive representation of structural dependencies in a semiconductor design flow having a plurality of stages, comprising:

a memory suitable for storing a program of instructions;

a processor communicatively coupled to the memory, the processor suitable for performing the program of instructions; and a display device communicatively coupled to the processor, the display device suitable for displaying data;

wherein the program of instructions configures the processor to detect a modified parameter of the semiconductor design flow and identify at least one parameter dependent on the modified parameter through use of a design relational database, the dependent parameter being modified at a stage of the design flow before the modification of the detected parameter, the design relational database indicating sets of relations between parameters of the design flow.

9. The system as described in claim 8, where in the relational database indicates at least one of directional and interdependent paramete rs.

10. The system as described in claim 8, wherein the relational database is viewable by a user so that when the relational database is viewed by a user, the relational database shows indications of parameter relationships.

11. The system as described in claim 8, wherein exportation of a design of a semiconductor device resultant for the design flow is prevented until flow parameters and relationships specified by a flow designer are completed.

12. The system as described in claim 8, wherein modification to a subsequent parameter of the design flow is prevented until identified dependent parameters have been verified.

13. The system as described in claim 8, wherein the program of instructions further configures the processor to display the identified dependent parameter on the display device.

14. A method for providing interactive representation of structural dependencies in a semiconductor design flow as imple mented by an information handling system, comprising:

detecting a modified parameter of the semiconductor design flow; and identifying at least one parameter dependent on the modified parameter, the dependent parameter identified through use of a design relational database indicating sets of relations between parameters of the design flow.

15. The method as described in claim 14, wherein the relational database indicates at least one of directional and interdependent paramete rs.

16. The method as described in claim 14, wherein the relational database is viewable by a user so that when the relational database is viewed by a user, the relational database shows indications of parameter relationships.

17. The method as described in claim 14, wherein the detected modified parameter is at a later stage of the design flow than the at least one parameter which was identified as dependent on the modified parameter.

18. The method as described in claim 14, wherein exportation of a design of a semiconductor device resultant for the design flow is prevented until flow parameters and relationships specified by a flow designer are completed.

19. The method as described in claim 14, wherein modification to a subsequent parameter of the design flow is prevented until identified dependent parameters have been verified.

20. The method as described in claim 14, further comprising displaying the identified dependent para meter.

* * * * *